United States Patent [19]

Irie et al.

[11] Patent Number: 4,982,831
[45] Date of Patent: Jan. 8, 1991

[54] PRINTED CIRCUIT BOARD ADAPTER SUPPLYING APPARATUS AND METHOD FOR USE IN PRINTED CIRCUIT BOARD DRILLING APPARATUS

[75] Inventors: Akira Irie, Aikawamachi; Yasuhiko Kanaya, Machida; Tamio Ohtani, Hadano, all of Japan

[73] Assignee: Hitachi Seiko, Ltd., Tokyo, Japan

[21] Appl. No.: 317,285

[22] Filed: Feb. 28, 1989

[51] Int. Cl.$^5$ ............................................. B65G 47/00
[52] U.S. Cl. .................................. 198/617; 198/341; 198/343.1; 198/346.1; 408/49
[58] Field of Search .................. 198/346.1, 346.2, 341, 198/345, 617, 343; 408/49, 62, 66, 87

[56] References Cited

U.S. PATENT DOCUMENTS

| | | | |
|---|---|---|---|
| 4,463,845 | 8/1984 | Harris | 198/341 |
| 4,867,297 | 9/1989 | Saitoh et al. | 198/346.2 |

*Primary Examiner*—Daniel W. Howell
*Attorney, Agent, or Firm*—Antonelli, Terry, Stout & Kraus

[57] ABSTRACT

An apparatus and method for supplying a printed circuit board to a printed circuit board drilling machine and for returning the printed circuit board after the drilling. A stocker stores a plurality of printed circuit boards in a tilted state, and a plurality of conveyor rollers provides a conveying path for the printed circuit boards. A conveyor device which includes conveyor rollers provides a conveying path connected to the first mentioned conveying path. The arrival of the printed circuit board is detected at a predetermined position, and the printed circuit board is then decelerated by braking in response to a signal from the detection. A device is provided on the printed circuit board drilling machine for delivering the printed circuit board to the printed circuit board drilling machine. A base plate can be provided with a pair of locating pins for being anchored to the drilling machine table and has the printed circuit board mounted thereon so that the drilling machine can handle one pattern and number of location pins regardless of the number and pattern of fixing pins on the printed circuit board.

4 Claims, 15 Drawing Sheets

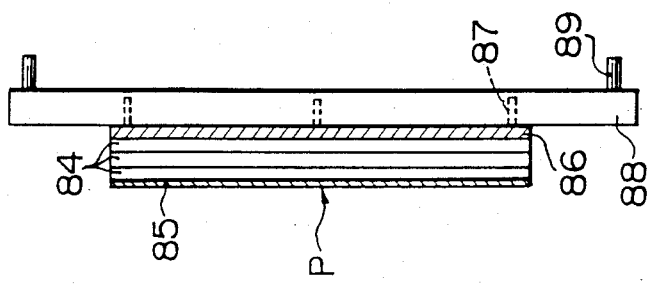
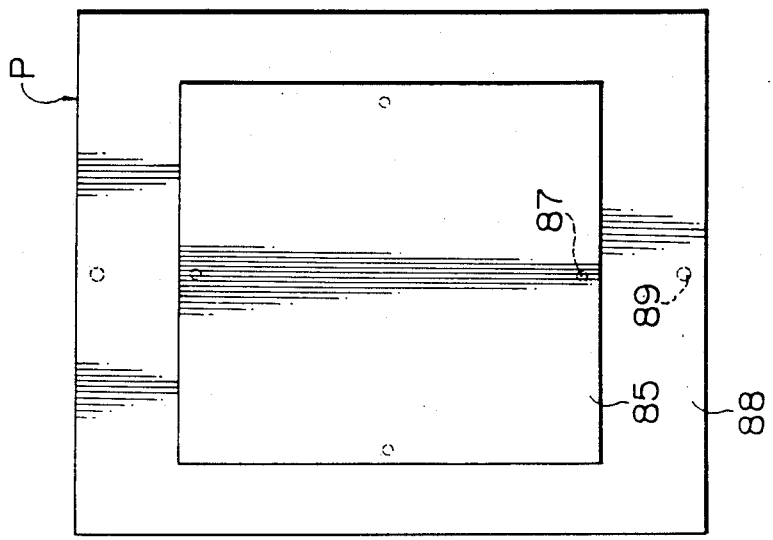

PRINTED CIRCUIT BOARD ADAPTER SUPPLYING APPARATUS AND METHOD FOR USE IN PRINTED CIRCUIT BOARD DRILLING APPARATUS

BACKGROUND OF THE INVENTION

The present invention relates to a printed circuit board adapter, supplying apparatus and method for use in a printed circuit board drilling machine. More particularly, the invention is concerned with a printed circuit board supplying apparatus and method capable of storing and conveying printed circuit boards in an oblique position and also an adapter or base plate for mounting a circuit board thereon so that printed circuit boards can be supplied to the drilling machine under standard conditions regardless of the number and location of fixing pins.

In general, a printed circuit board to be fed to a printed circuit board drilling machine has a laminated structure composed of an upper plate, a printed circuit board and a lower plate which are stacked in layers. These layers are integrally fixed to each other usually by means of two to four reference pins which are pressed into the laminated structure. These reference pins are fixed or clamped by suitable fixing structure disposed on a drilling machine table. Therefore, it is necessary to locate the reference pins in conveying the printed circuit boards.

A known printed circuit board supplying apparatus and method for supplying printed circuit boards to a drilling machine conveys the printed circuit boards in an oblique posture. Such a printed circuit board supplying apparatus is disclosed, for example, in Japanese Patent Unexamined Publication Nos. 60-262720, 60-263639, 62-259741, 62-259742, and 62-297042, and Japanese Utility Model Unexamined Publication Nos. 61-137446 and 61-201748. This type of printed circuit board supplying apparatus generally has power driven rollers for conveying the printed circuit boards, so that the supplying apparatus has a compact and simple construction. In addition, this type of apparatus advantageously enables easy replacement of the printed circuit boards in a stocker during the drilling operation.

In the foregoing known printed circuit board supplying apparatus in which the printed circuit boards simply rest on power-driven rollers, stoppers are disposed along the conveying path of the printed circuit board in order to locate the printed circuit boards such that the reference pins on the printed circuit boards being conveyed contact with and are stopped by the stoppers.

This arrangement does cause the printed circuit board to be undesirably tilted due to inertia of the upper portion of the printed circuit board when the reference pins are stopped by the stoppers, particulary when the conveying speed is high. In such a case, the reference pins of a tilted circuit board may not be aligned with the fixing or clamping device provided on the drilling table, with the result that the printed circuit board is not properly supplied to the table for a drilling operation. To avoid this problem, it has been found necessary using known procedures to slow the conveying speed considerably to avoid the inertia and tilting problems, e.g. 13 to 15 meters per minute.

SUMMARY OF THE INVENTION

Accordingly, an object of the present invention is to provide a printed circuit board supplying apparatus and method for use in a printed circuit board drilling machine, which is capable of conveying printed circuit boards at considerably higher speeds, e.g. 25 meters per minute, to enable replacement of the printed circuit board in a short time, and to provide a circuit board adapter for mounting a circuit board thereon so that the printed circuit board can be supplied to the drilling table under standard conditions regardless of the number and location of fixing pins.

To this end, the present invention provides a printed circuit board supply apparatus and method for use in a printed circuit board drilling machine in which a stocker is provided on one lateral side of the printed circuit board drilling apparatus and includes a magazine capable of storing a plurality of printed circuit boards at a predetermined spacing and in a tilted state.

The magazine is intermittently shifted by a distance corresponding to the predetermined spacing, and a plurality of rotatable rollers oppose the printed circuit board and providing a conveying path for the printed circuit boards. Delivery means move the rollers in a direction parallel to the tilt of the printed circuit boards so as to lift the printed circuit boards within the magazine, thereby allowing the printed circuit boards to be moved into and out of the magazine.

A conveyor device is arranged on the front side of the printed circuit board drilling machine and includes a plurality of rollers providing a conveying path for the printed circuit boards. Detection devices are arranged along the conveying path for detecting a printed circuit board conveyed along the path.

Braking means are arranged along the conveying path for reducing the conveying speed of the printed circuit board in response to a signal produced by the detection devices. A stopper is provide for stopping the printed circuit board at a predetermined position, and a delivery device is provided on the printed circuit board drilling machine table and includes reclining arms swingable between a delivery position where they support the printed circuit board which is being conveyed and a supply position where they deliver the printed circuit board onto the table.

When a printed circuit board which has been delivered from the stocker to the conveyor device is detected, the braking means operates in response to the produced detection signal, so as to hold the printed circuit board and to lower the speed of the conveyor roller, thereby reducing the conveying speed to such a lever as not to cause tilting of the printed circuit board due to inertia when the reference pins are contacted by the stoppers.

BRIEF DESCRIPTION OF THE DRAWINGS

These and other objects, features and advantages of the present invention will become clear from the following description when the same is read in conjunction with the accompanying drawings wherein:

FIGS. 17(A) and 17(B) are a plan view and a side elevational view showing the state in which a printed circuit board is attached to the base plate.

DETAILED DESCRIPTION

Figure 1:
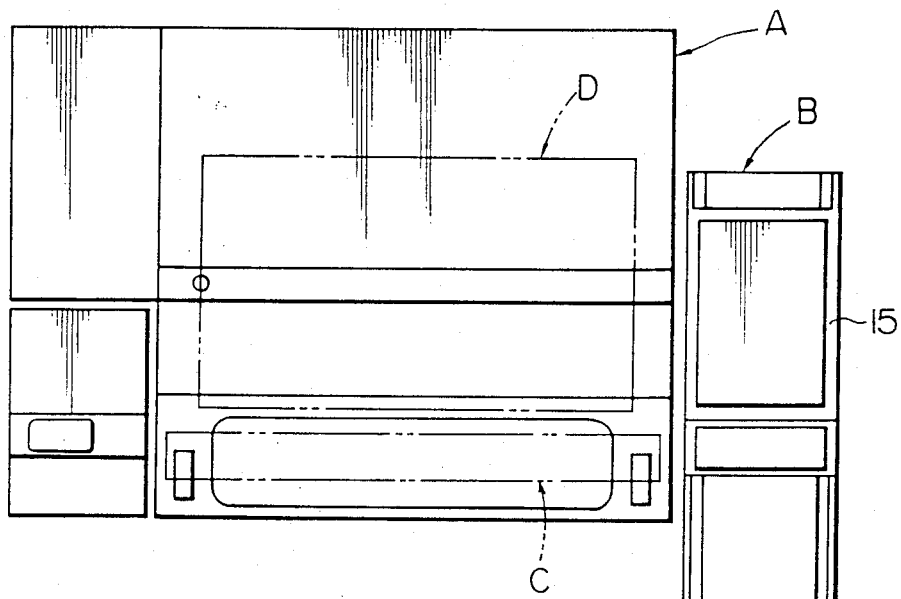
FIG. 1 is a plan view of a printed circuit board supplying apparatus in accordance with the present invention.

Referring first to FIG. 1, a printed circuit board drilling machine A has a stocker B and a conveyor device C annexed thereto. The printed circuit board drilling machine A also has a table which is provided with a delivery device D.

Figure 2:
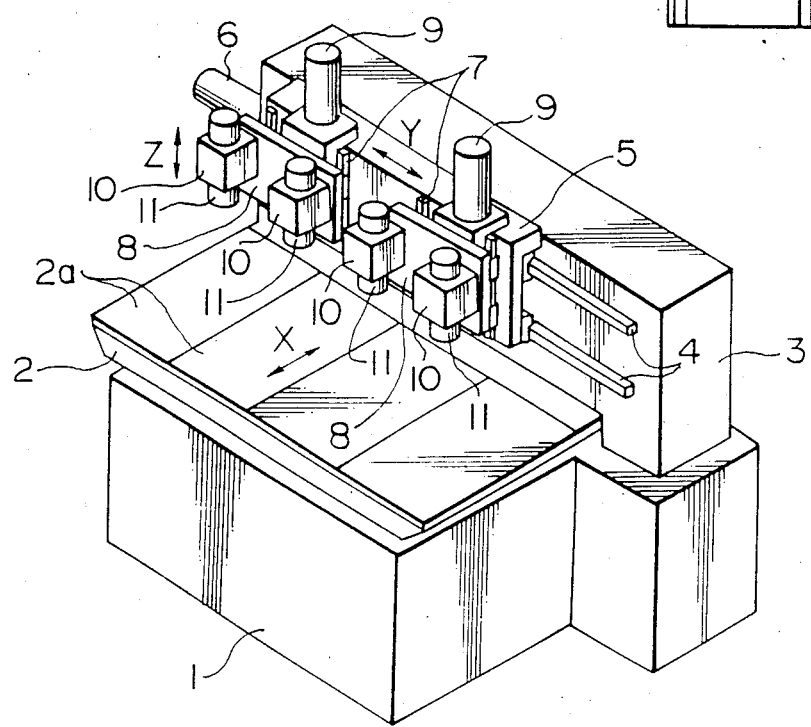
FIG. 2 is a perspective view of a printed circuit board drilling machine which is used in combination with the printed circuit board supplying apparatus shown in FIG. 1.

FIG. 2 shows the printed circuit board drilling machine A which has a table 2 mounted on a bed 1 for movement in the direction designated by arrow X. A column 3 is disposed on the bed 1 in such a manner as to straddle over the table 2. A guide rail 4 is fixed to the column 3 and movably carries a cross-slide 5. A motor 6 is supported by the column 3 and is capable of driving a feed screw (not shown) which extends in parallel with the guide rail 4 thereby moving the cross-slide in the direction designated by arrow Y. Another guide rail 7 is fixed to the cross-slide 5 and movably carries a saddle 8. A motor 9 mounted on the cross-slide 5 drives a feed screw (not shown) rotatably carried by the cross-slide 5, thereby moving the saddle 8 in the direction designation by arrow Z. A spindle 10 fixed to the saddle 8 has a rotary shaft and a motor for driving the rotary shaft. A chuck provided on one end of the rotary shaft is capable of holding a drill. A pressure foot 11 is movably mounted on one end of the spindle 8 in such a manner as to cover the rotary shaft and the drill.

Figure 7:
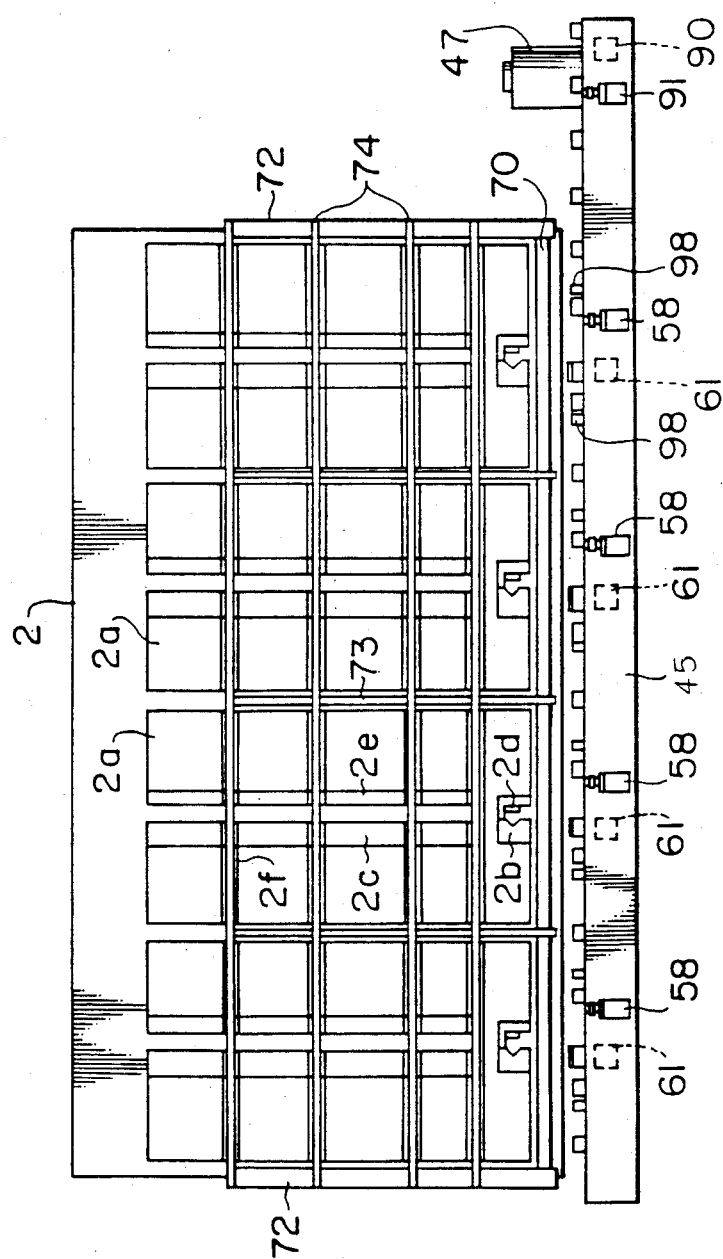
FIG. 7 is a plan view of delivery device incorporated in the printed circuit board supplying apparatus shown in FIG. 1.

The drilling table 2 is shown in FIG. 7 where a plurality of sub-tables 2a are arranged at a predetermined interval and fixed to the table 2. A fixed guide 2b having a V-shaped groove is fixed to each sub-table 2a. Another fixed guide 2c is fixed to each sub-table 2a. A movable guide 2d opposes the fixed guide 2b and is driven from within the table 2. A movable guide 2e opposes the fixed guide 2c, and is also driven from within the table 2. The sub-table 2a, the stationary guide 2c and the movable guide 2e have grooves 2f parallel to the longitudinal axis of the table 2.

Figure 3:
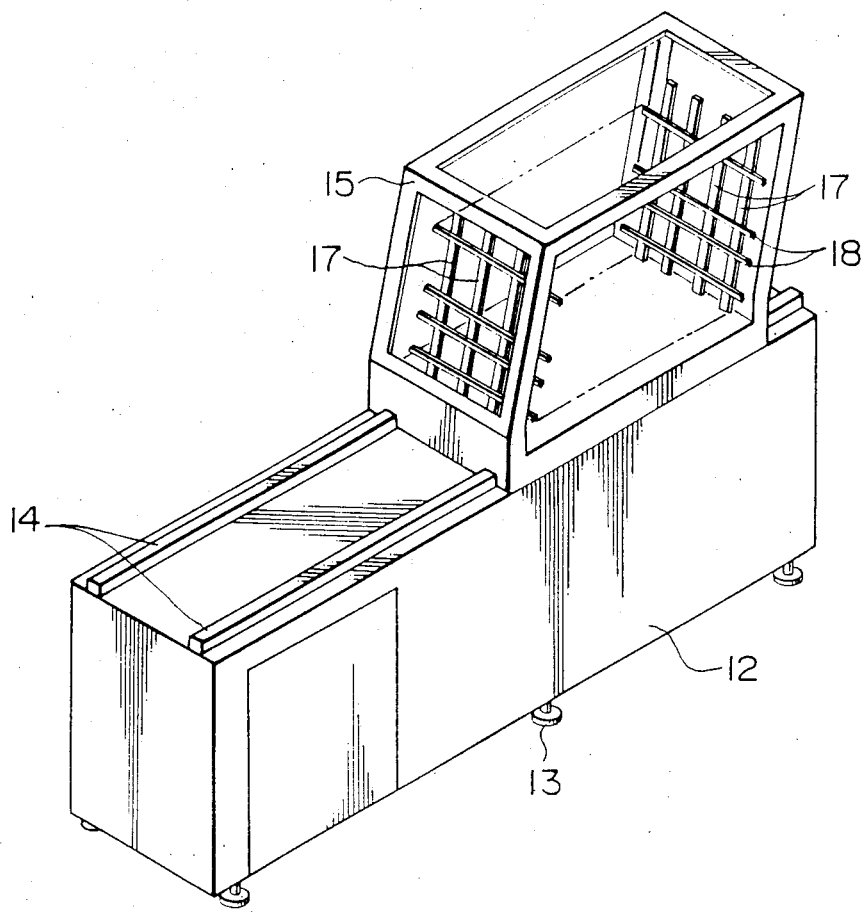
FIG. 3 is a perspective view of a stocker shown in FIG. 1.
Figure 4:
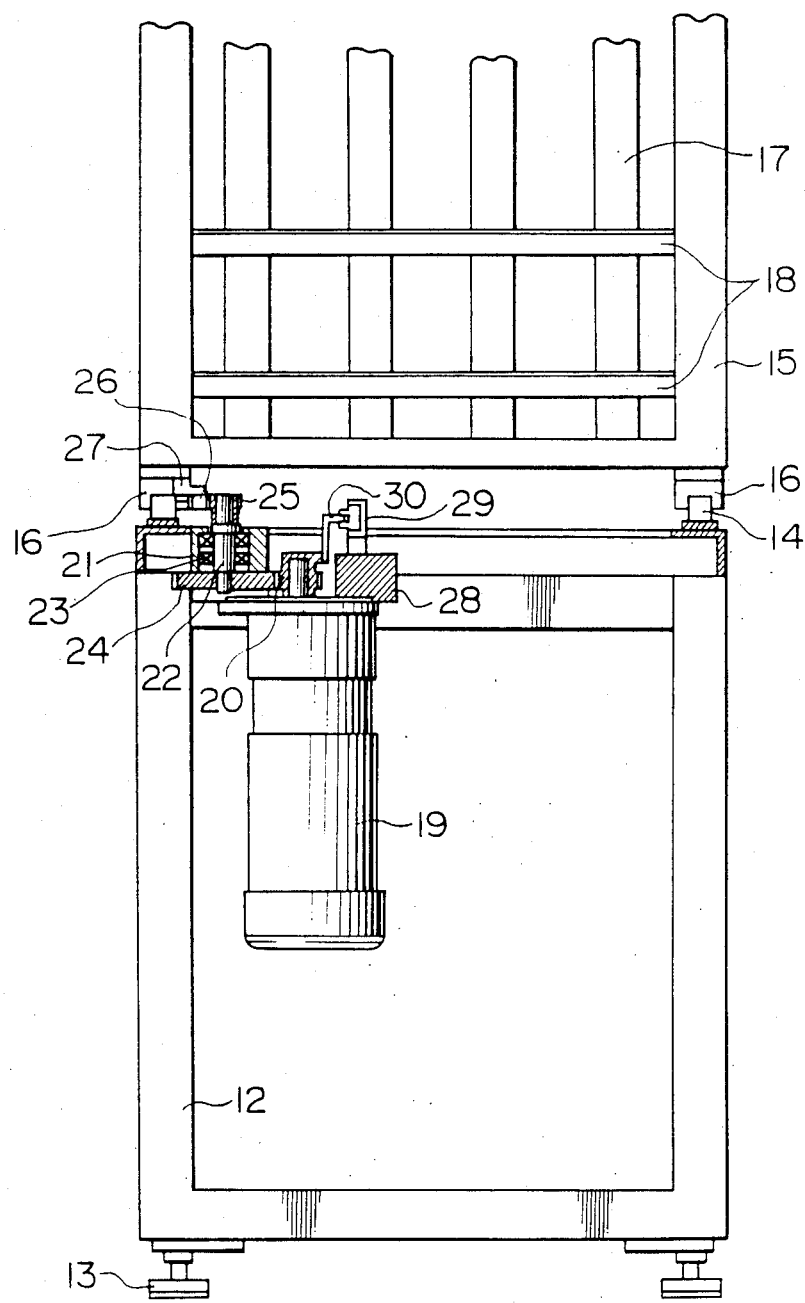
FIG. 4 is a front elevational sectional view of a magazine shifting means.
Figure 5:
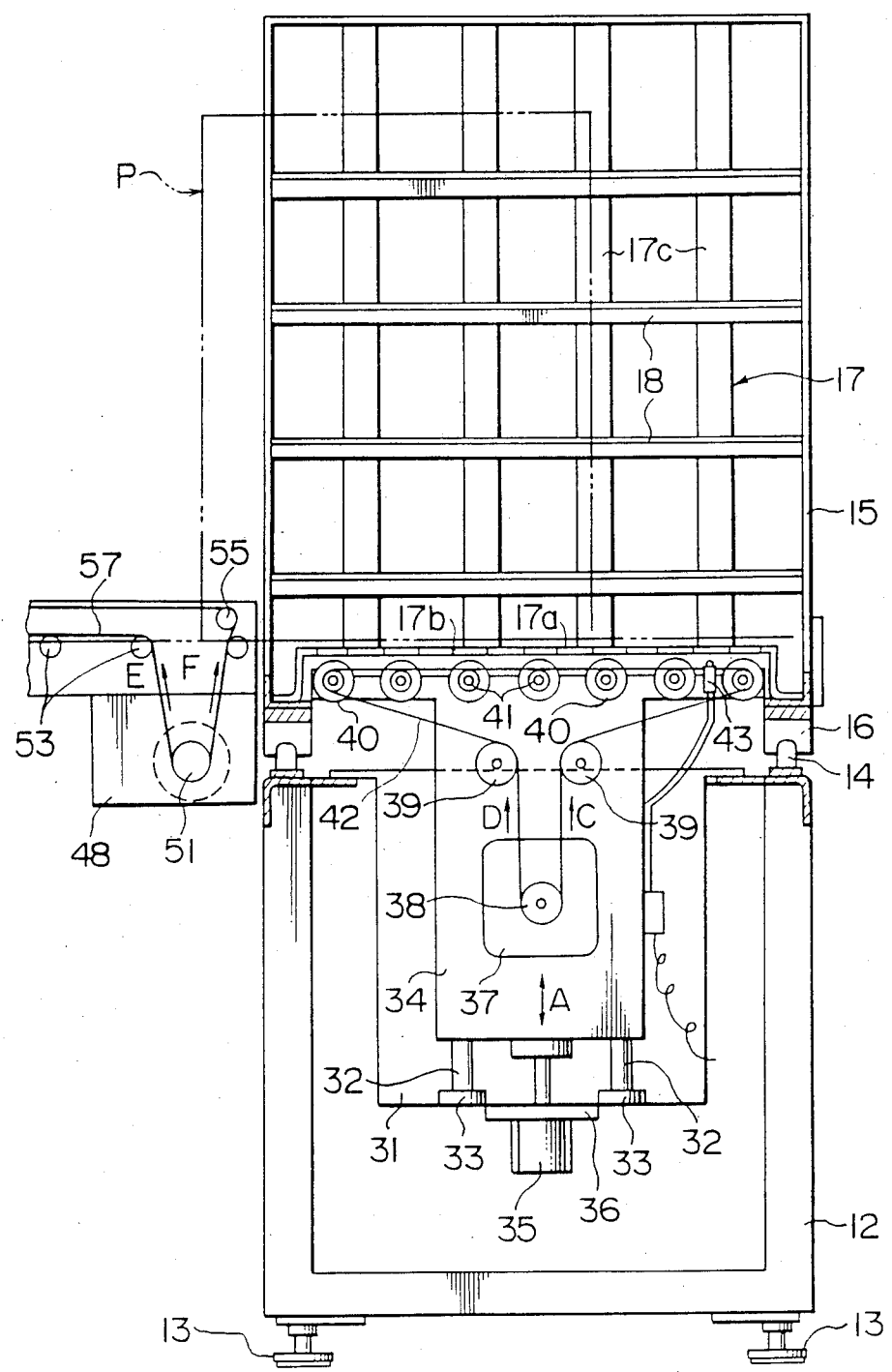
FIG. 5 is a front elevational view of a delivery or conveyor means.
Figure 6:
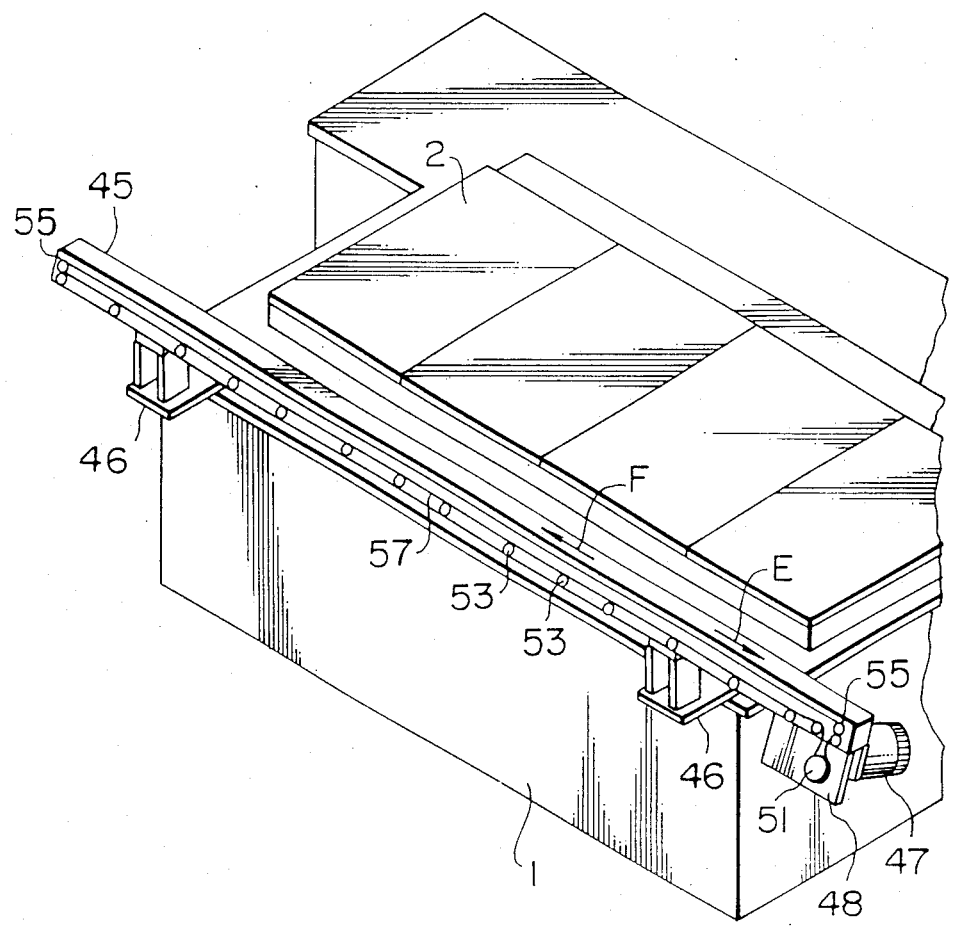
FIG. 6 is a perspective view of a conveyor device incorporated in the printed circuit board supplying apparatus shown in FIG. 1.

The stocker B is shown in FIGS. 3 to 5 and has a base 12 provided with adjusting legs 13. Guide rails 14 are fixed to the base 12. A magazine 15 is supported by a linear bearing 16 (FIG. 4) which movably fits on the guide rails 14. Partition plates 17 have a plurality of receiving plates 17a provided with a plurality of notches 17b arranged at a predetermined interval at the bottom of the magazine 15, and a plurality of supporting plates 17c arranged at a predetermined interval in the magazine 15. Guide rails 18 are fixed to the partition plates 17 at a predetermined interval.

A motor 19 carried by the base 12 has a shaft to which a gear 20 is fixed A shaft 22 is rotatably supported by a bearing block 21 through a bearing 23. A gear 24 is fixed to the shaft 22 and meshes with the gear 20 on the motor shaft. A pinion 25 meshes with a rack 26 fixed to the magazine 15 through a bracket 27. As the motor 19 is started, the pinion 25 is rotated through the gear 20, gear 24 and the shaft 22, so that the magazine 15 is moved along the guide rails 14 A sensor 29 is fixed to a bracket 28 fixed to the motor 19. A dog 30 is fixed to the shaft of the motor 19 and cooperates with the sensor 29 so that the motor 19 is stopped when the dog 30 is detected by the sensor 29 after the sensor has left the dog 30. This periodic stopping of the motor 19 provides for feeding or shifting of the magazine 15 in a pitch-by-pitch fashion.

A base 31 is fixed to the base 12 so as to be located under the position where the discharge and supply of the printed circuit boards are effected A guide bar 32 is fixed to the base 31 through an intermediate bracket 33. The guide bar 32 movably supports a base 34. A cylinder 35 supported by the base 31 through a bracket 36 has a piston rod which is coupled to the movable base 34 for movement of the base 34 in the direction designated by arrow A.

A motor 37 is supported by the movable base 34. A sprocket 38 is fixed to the shaft of the motor 37. Another sprocket 39 is rotatably carried by the movable base 34. Rollers 40 are rotatably supported by the movable base 34. Sprockets 41 are joined with the rollers 40. A chain 42 goes around the sprocket 38, sprocket 39 and the sprockets 41 so that the rollers 40 are rotationally driven by the motor 37. The conveyance of the printed circuit boards is effected by raising the movable base 34 by the power of the cylinder 35 and allowing a portion of the rollers 40 to be projected and moved to the conveying position through the notches 17b in the receiving plates 17a in the magazine 15. The printed circuit boards can be conveyed out of the magazine 15 by driving the chain 42 in the direction of arrow C. Conversely, driving the chain 42 in the direction of arrow D causes the printed circuit board to be fed into the magazine 15. The arrival of a printed circuit board conveyed into the magazine 15 is detected by a sensor 43 which is fixed to the movable base 34.

The conveyor device C is shown in FIGS. 6 to 11. A frame 45 is supported by the bed 1 of the printed circuit board drilling machine A through intermediate brackets 46. A motor 47 is carried by the frame 45 through a bracket 48. A sprocket 51 is fixed to the shaft of the motor 47. A shaft 49 (FIG. 8) is rotatably supported by the frame 45 through bearings 50. A roller 52 is fixed to one end of the shaft 49. A sprocket 53 is keyed to one end of the shaft 49. A plurality of shafts 49 with rollers 52 and sprockets 53 are arranged at predetermined intervals in the longitudinal direction of the frame 45. The rollers 52 are arrayed in a line and provide a conveyance path for the printed circuit boards.

Sprockets 55 are rotatably fixed to both ends of the frame 45. A guide 56 is fixed to the frame 45 at an intermediate position between these sprockets 55 and supported a chain 57 which goes around the sprocket 51, sprockets 53 and the sprockets 55. As the motor 47 moves the chain 57 in the direction of arrow E, the printed circuit boards are fed into the magazine 15. Conversely, driving of the chain 57 in the direction of arrow F causes the printed circuit boards brought out of the magazine 15 to be moved to a corresponding portion of the table 2.

A pad 60 is fixed to the end of the piston rod of the cylinder 58 which is fixed to the frame 45 through a bracket 59 so as to oppose movement of the printed circuit boards along the conveying path. In other words, the arrangement of the pad 60 and cylinder 58 is such that, when a printed circuit board conveyed by the rollers 52 has reached a predetermined position, the cylinder 58 is actuated to press the pad 60 to the printed circuit board, thereby stopping the further conveyance of the printed circuit board. Thus, the cylinder 58 and the pad 60 provide the novel concept of a brake for ensuring that the printed circuit board is correctly supplied to the table 2. Sensors 61 are fixed to the frame 45 to detect the position of a printed circuit board which is being conveyed at high speed so as to produce a signal for actuating the cylinder 58 and its associated pad 60 to oppose further conveyance of the printed circuit board along the conveying path.

Cylinders 62 are fixed to the frame 45 via a bracket 63. Stoppers 64 are rotatably carried by a shaft 65 which is fixed to the frame 45. A link 66 has one end swingably connected to the piston rod of an associated one of each of the cylinder 62 through a pin 67, and the other end of each link 66 is swingably connected to the associated stopper 64 through a pin 68. Therefore, each stopper 64 is pivoted when the cylinder 62 is powered between an operating position where the stopper 64 engages with a reference pin 89 on the printed circuit board P (FIG. 9) which has been conveyed from the magazine 15 and an inoperative or stand-by position where the stopper 64 does not engage with the reference pin.

Figure 11:
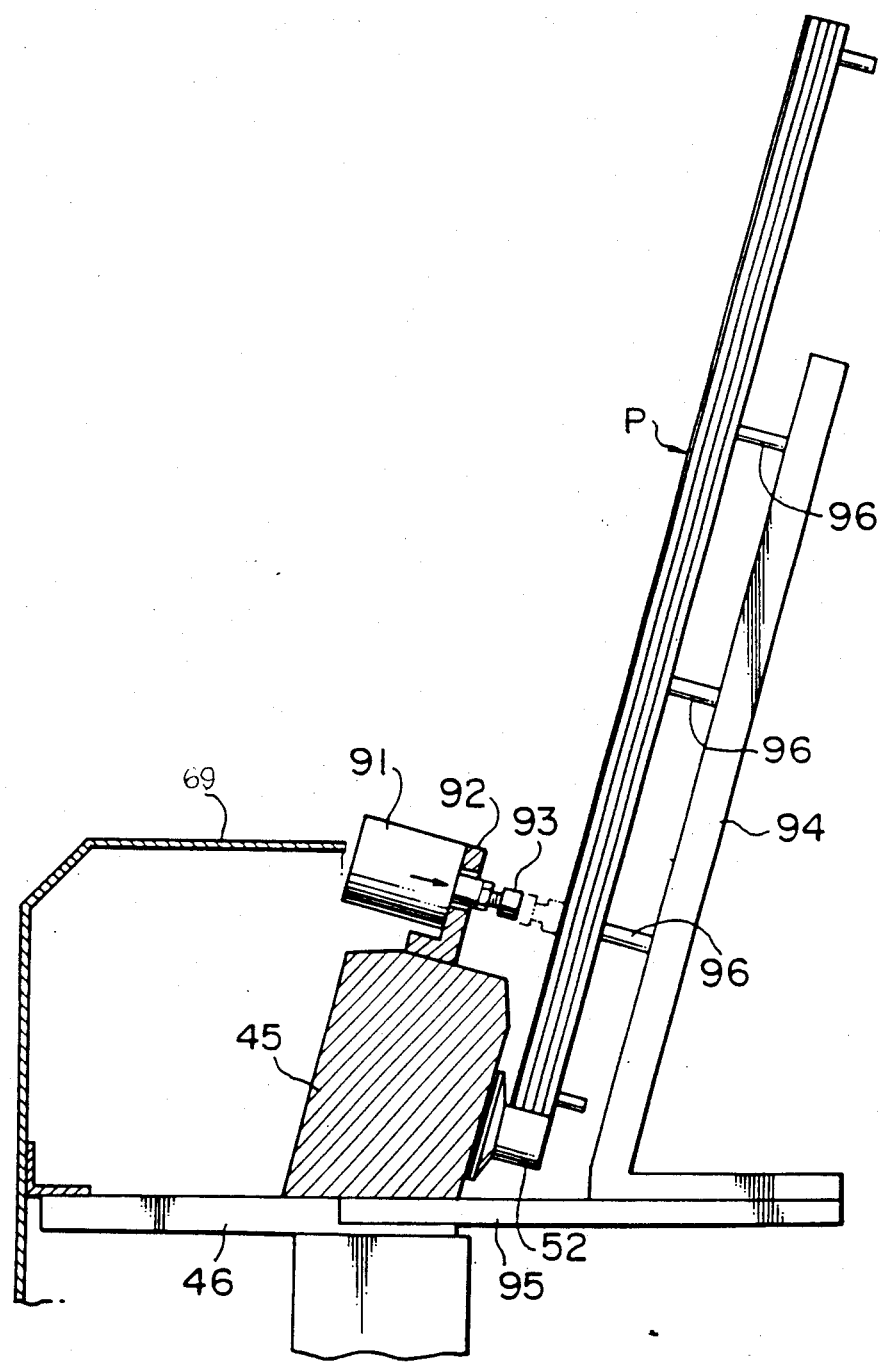
FIG. 11 is a side elevational view of a braking means.
Figure 12:
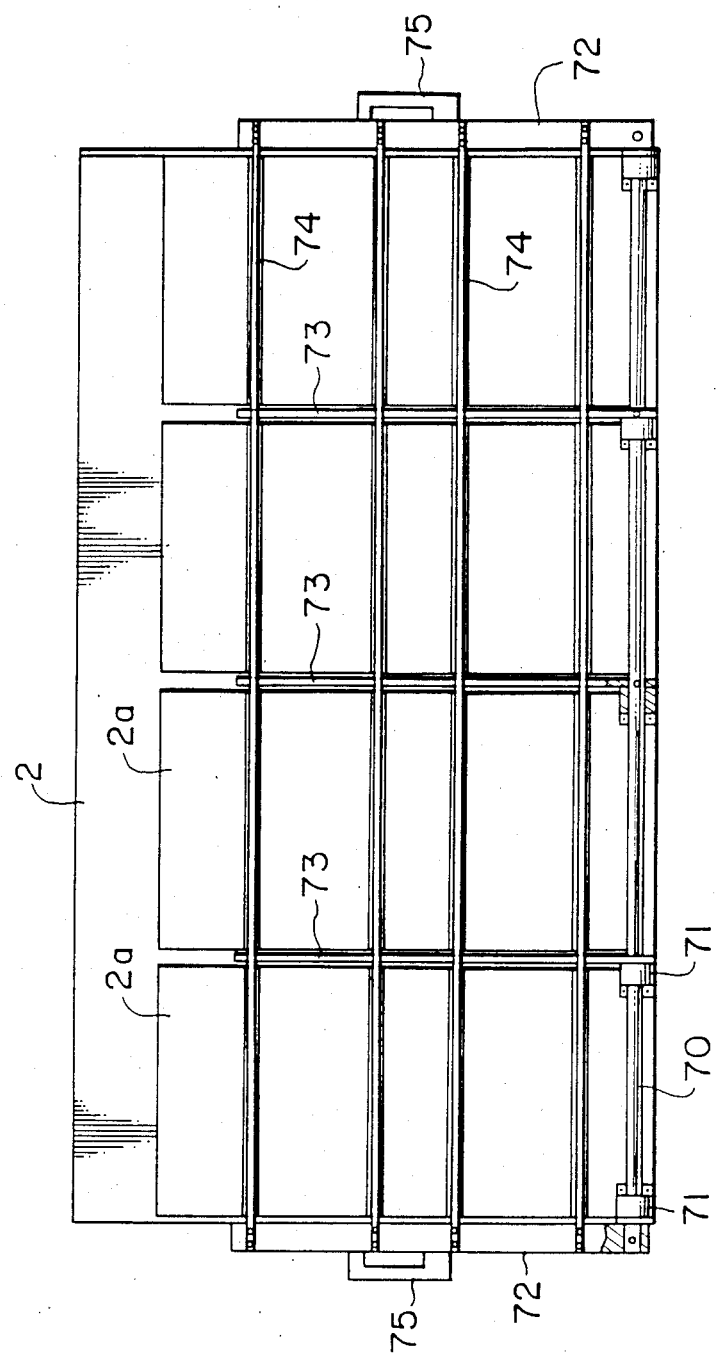
FIG. 12 is an enlarged plan view of the delivery device.

A sensor 90 (FIG. 7) is fixed to the frame 45 in such a manner that it issues a signal when a drilled printed circuit board is detected upon being returned to the magazine 15 and thereby actuate a cylinder 91 which is fixed to the frame 45 through a bracket 92 so as to face the conveyance path of the printed circuit boards and oppose further movement of the returned drilled printed circuit board to prevent tilting of the board on the magazine. A pad 93 is fixed to the end of a piston rod of the cylinder 91 as shown in FIG. 11. When a drilled printed circuit board conveyed by the rollers 52 toward the magazine 15 has reached a predetermined position, the cylinder 91 is actuated upon a signal from the sensor 90 to press the pad 93 onto the printed circuit board, thereby stopping movement of the printed circuit board. The cylinder 91 and the pad 93 provide novel braking mechanisms for ensuring that the printed circuit board is safely moved into the magazine 15.

A guide 94 is fixed to the frame 45 between the printed circuit board drilling machine A and the stocker B. Guide rails 96 are fixed to the guide 94 at several points.

The motor 47, cylinder 58 and the cylinder 62 operate in accordance with the detection signal derived from the sensor 61, while the cylinder 91 is operated in accordance with the detection signal from the sensor 90 as previously described. Cylinders 97 are fixed to the frame 45 and have a piston rod to which is fixed a board supporting device 98 (FIG. 10) which is movably carried by the frame 45. A cover 69 is provided over the frame 45 to shield the various components, e.g. motors 62 and 97.

The delivery device D is shown in FIGS. 7, 8, and 12 to 14. A shaft 70 is rotatably mounted on the table 2 through a bearing 71. An arm 72 is fixed to each end of the shaft 70 so as to be located outside the sub-tables 2a. Auxiliary arms 73 are fixed to a central region of the shaft 70 so as to be located at positions intermediate adjacent sub-tables 2a. Guide rails 74 are arranged at predetermined intervals and are fixed to the arms 72 and the auxiliary arms 73. A bracket 75 (FIGS. 12 and 13) fixed to each arm 72 is provided with a groove 75a and a notch 75b.

A bearing block 76 has trunnion shafts 77 projecting from both sides thereof and is rotatably carried by plates 78 which are secured to the frame 1 of the printed circuit board drilling machine A, such that the bearing block 76 is opposite the bracket 75 when the table 2 is in the delivery position. A pneumatic cylinder 79 is fixed to the bearing block 76. The bearing block 76 movably supports a guide bar 80 which extends parallel to the cylinder 79. The piston rod of the cylinder 79 and the guide bar 80 are connected to each other through a connecting member 81. A hinge roller 82 is rotatably secured to the connecting member 81 opposite the groove 75a of the bracket 75. An engaging pin 83 is fixed to the connecting member 81 to engage the notch 75b in the bracket 75 when the arm 72 is raised.

Figure 13:
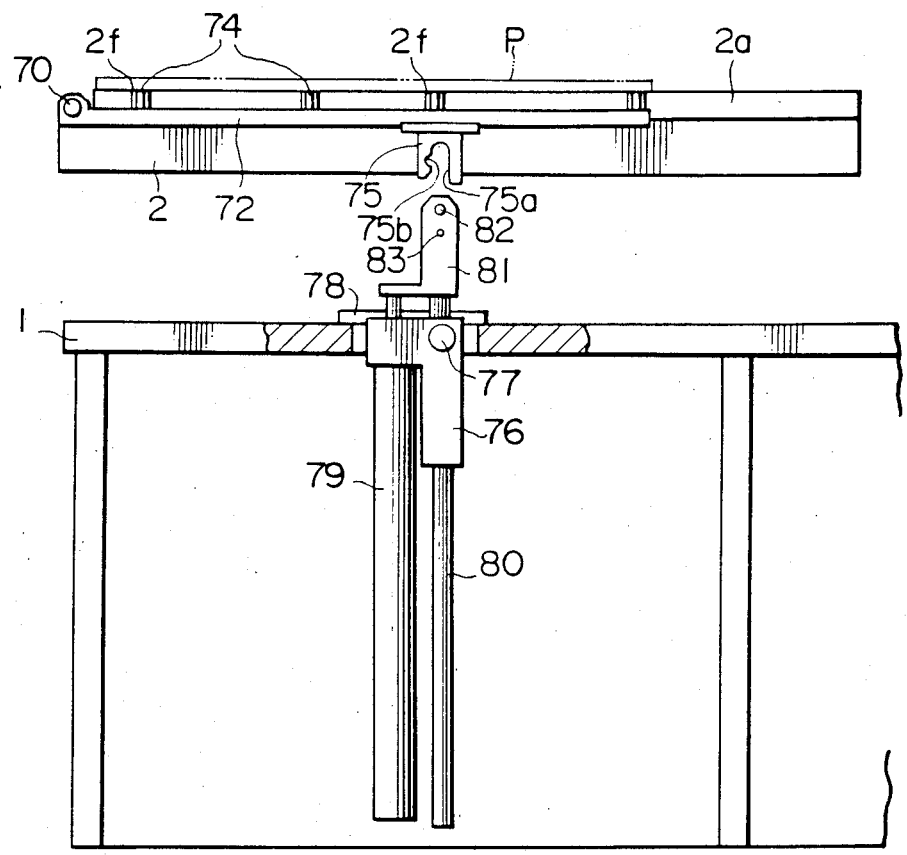
FIG. 13 is a side elevational view of the delivery device.
Figure 14:
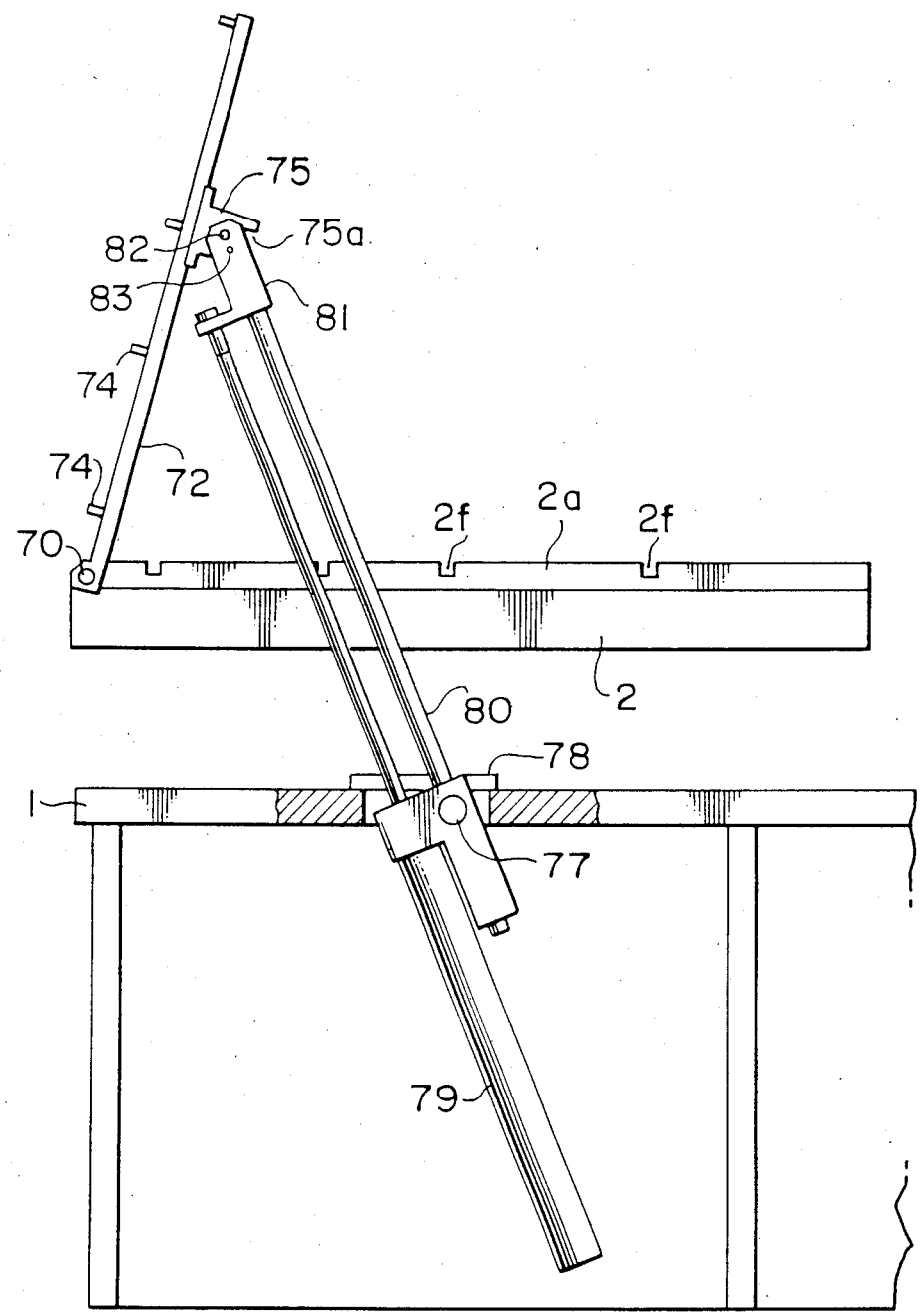
FIG. 14 is an illustration of operation of the delivery device.

Referring specifically to FIG. 13, the cylinder 79 is operated when the arm 72 is in the supply position, so that the connecting member 81 is raised to bring the hinge roller 82 into engagement with the groove 75a in the bracket 75 and the bracket 75 is moved upwardly, thereby rotating the arm 72 to the raised transfer position as shown in FIG. 14. During this movement, the bearing block 76 has rotated about the shaft 77, and the engaging pin 83 is brought into engagement with the notch 75b in the bracket 75. When the cylinder 79 now is operated to return the arm 72 to the supply position, the arm 72 is also moved together with the connecting member 81, because the engaging pin 83 is held in engagement with the notch 75b in the bracket 75.

FIGS. 15 to 17 show an example of the type of printed circuit board whose handling is remarkably improved by the apparatus and method of the present invention. The printed circuit board comprises a laminated printed circuit board 84, an upper plate or entry board 85 superposed over the laminated printed circuit board 84, and a lower plate 86 underlying the laminated printed circuit board 84. Fixing pins 87 fix and tie the upper plate 85, printed circuit board 84 and the lower plate 86 together.

Figure 15A:
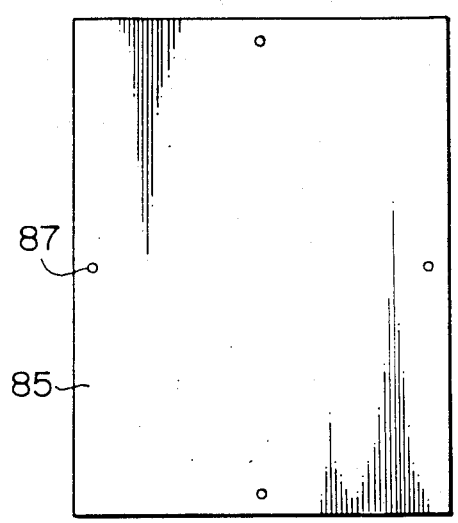
FIGS. 15(A) and 15(B) are plan view and a side elevational view of a layered printed circuit board, respectively;]
Figure 15B:
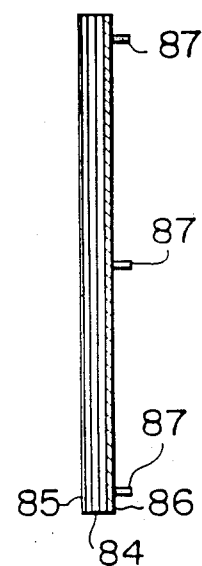
Figure 16A:
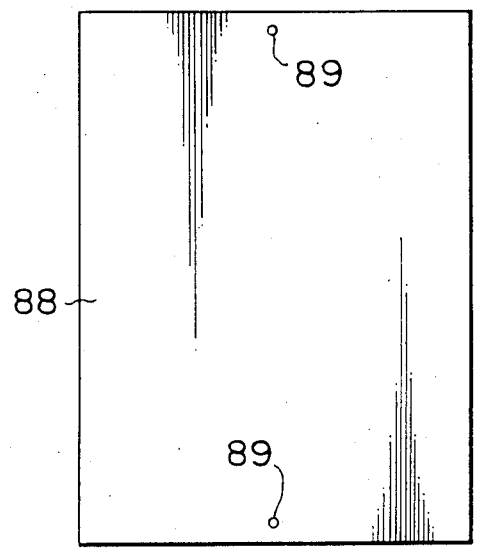
FIGS. 16(A) and 16(B) are a plan view and a side elevational view of a base plate to which the printed circuit board is to be secured.
Figure 16B:
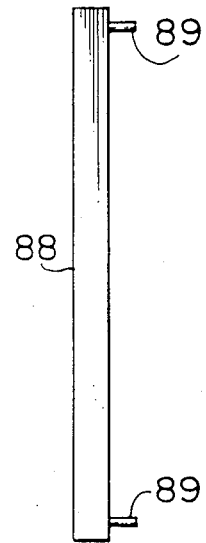

A novel base plate 88 as shown in FIGS. 16A and 16B is provided with a pair of locating reference pins 89. As will be best seen from FIGS. 17A and 17B, the fixing pins 87 of the printed circuit board shown in FIGS. 15A and 15B are anchored in the base plate 88 so that the laminated printed circuit board 84 is integrally fixed to the base plate 88. This permits the drilling machine table to handle on size and arrangement of reference pins regardless of the number and pattern of fixing pins on the printed circuit board. In the following description, the assembly including the base plate 88 and the printed circuit board 84 will be referred to as a printed circuit board P.

When the printed circuit board P has been correctly placed on the table 2 of the printed circuit board drilling machine A, the reference pins 89 are clamped between the fixed guide 2b and the movable guide 2d and between the fixed guide 2c and the movable guide 2e, respectively, so that the printed circuit board P is firmly fixed or anchored to the table 2 to assure precision drilling.

The holes in the base plate 88 for anchoring the fixing pins 87 are formed by the printed circuit board drilling machine A after securing the base plate 88 to the table 2, so that the coordinate positions of the holes are highly accurately aligned with the printed circuit board drilling machine A. The use of the base plate 88 assures that the printed circuit boards P are supplied to the printed circuit board drilling machine A under the same or standard conditions, regardless of the position and the number of the fixing pins 87 which fix the upper plate 85, the printed circuit board 84 and the lower plate 86.

The operation of the apparatus will now be described. A printed circuit board P is supplied from the magazine 15 to the table 2 of the printed circuit board drilling machine A by the starting of motor 19 of the stocker B. The dog 30 makes one full rotation so that the magazine 15 is fed forward by one pitch, thereby moving the printed circuit board P to the supply/discharge position. The motor 19 is stopped in response to the detection signal which is produced by the sensor 29 upon detection of the dog 30. At the same time, the cylinder 79 of the delivery device D is operated to swing the arms 72 to the delivery position.

Subsequently, the motor 37 of the stocker B is operated to make the chain 42 to run in the direction of the arrow C. At the same time, the conveyor device C starts its motor 47 thereby driving the chain 57 in the direction of the arrow E so as to drive the rollers 52. Then, the cylinder 35 is actuated to raise the movable base 34. Thereafter, the rollers 40 are operated to raise the printed circuit board P on the receiving plates 17a to the conveying position and forward the board P toward the conveyor device C. As the printed circuit board P is delivered from the magazine 15, the cylinder 35 lowers the movable base 34, thus preparing for the delivery of the next printed circuit board. By this procedure, the printed circuit boards P are successively fed out of the magazine 15.

Figure 8:
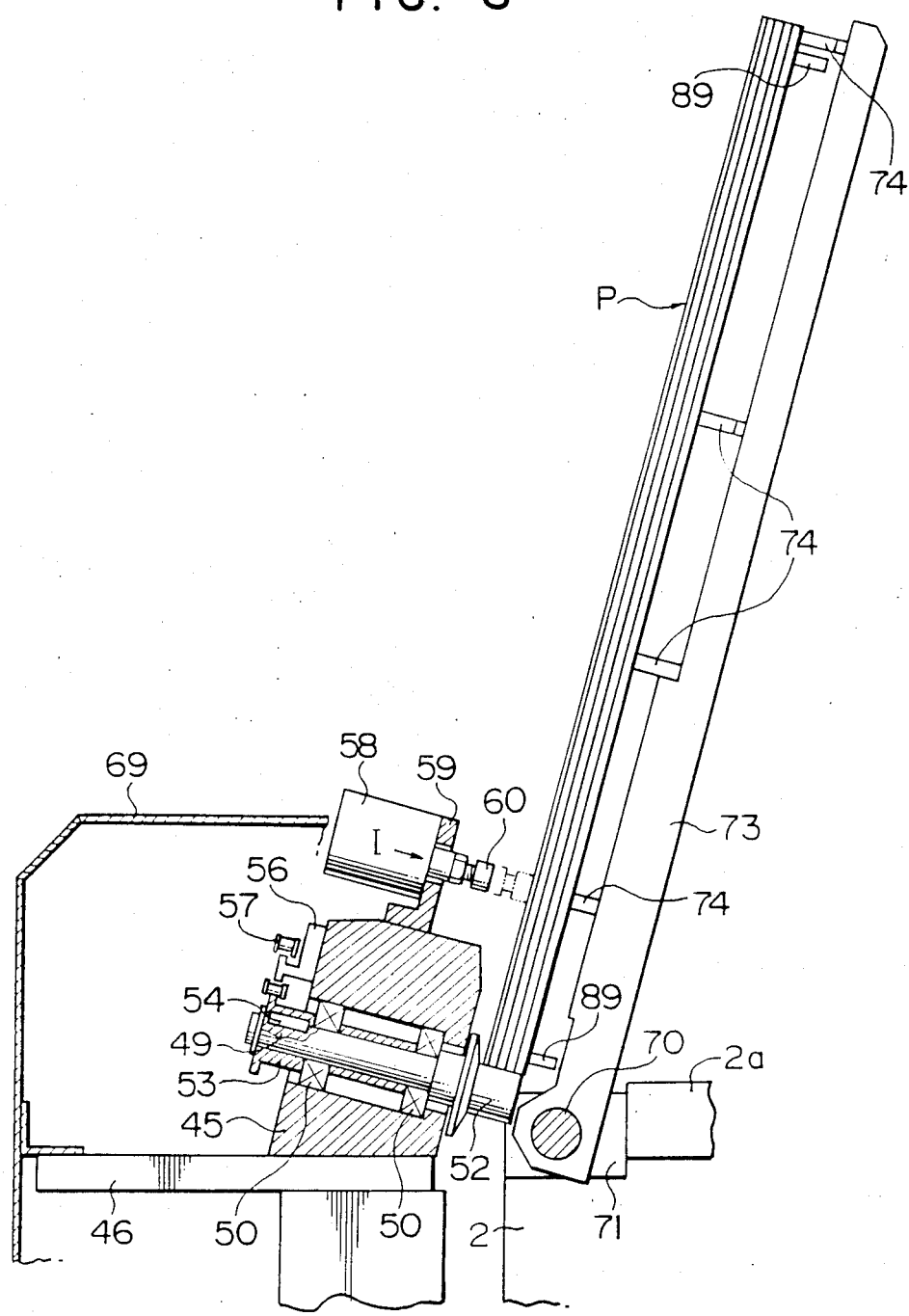
FIG. 8 is a side elevational view of a braking means.
Figure 9:
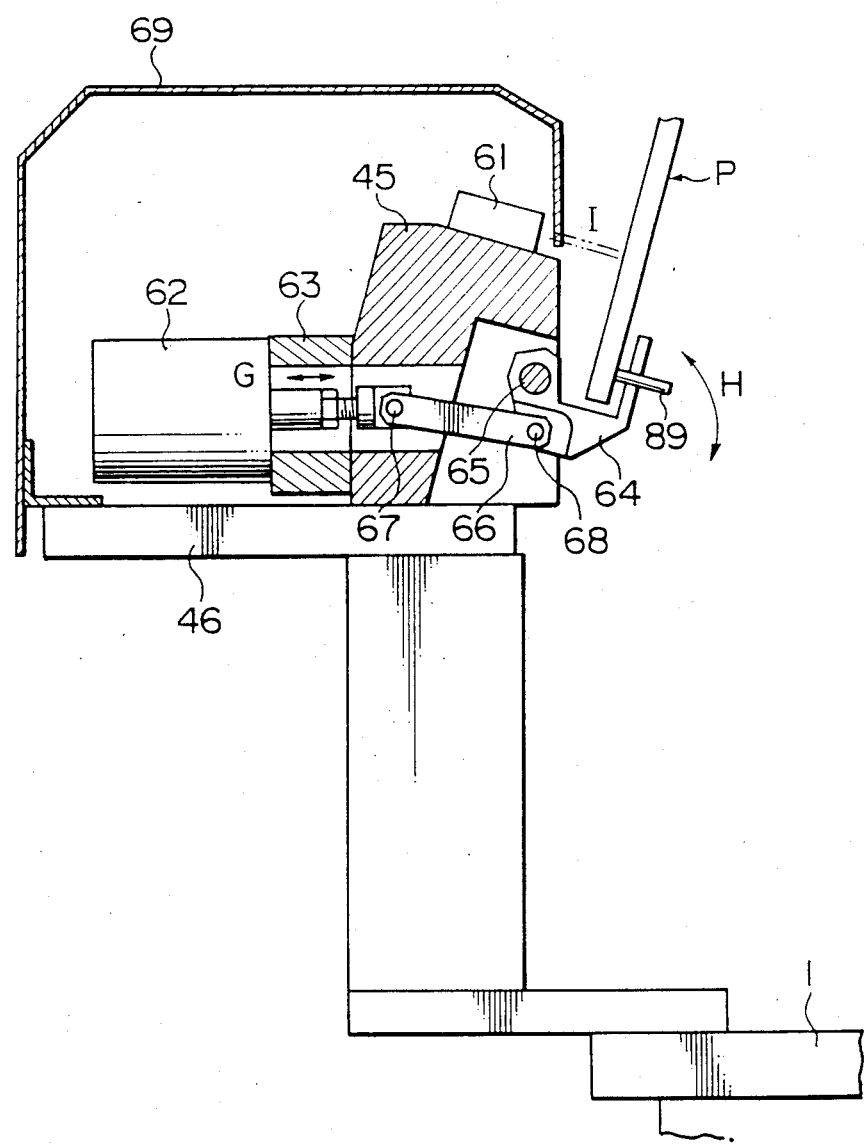
FIG. 9 is a side elevational view of a stopper and a sensor.
Figure 10:
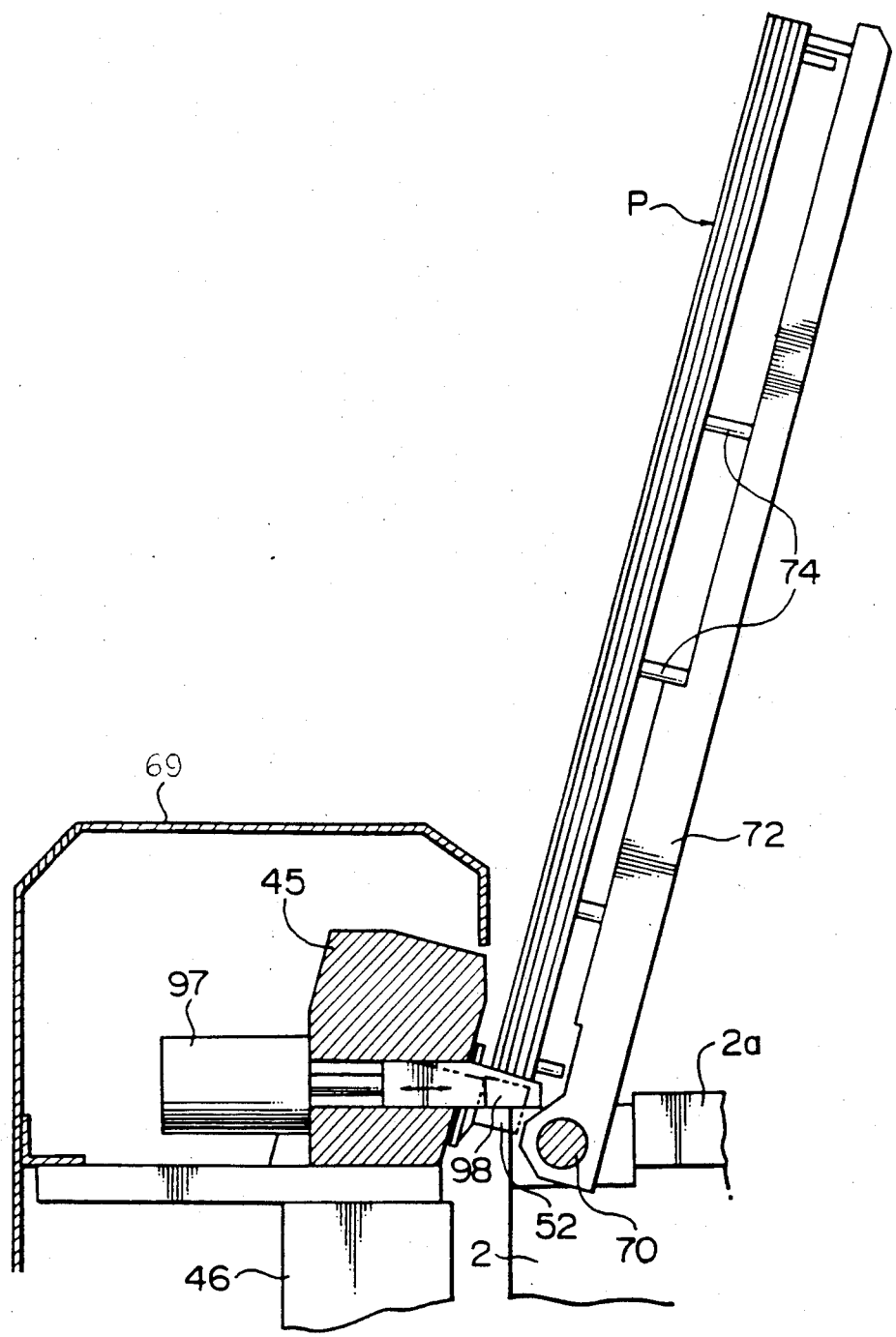
FIG. 10 is a side elevational view of printed circuit board receiving device.

The printed circuit board P brought out of the magazine 15 is then conveyed by the rotating rollers 52. During this conveyance, the printed circuit board P is supported by the rollers 52 and the guide rail 74 as shown in FIG. 8. The approach of the printed circuit board P to the position where it is to be stopped is detected by the sensor 61. The sensor 61 then produces a detection signal in response to which the cylinder 58 and the cylinder 62 are operated. As result, the pad 60 is pressed against the printed circuit board P so as to stop the conveying movement of the printed circuit board P at a position which immediately precedes the position where the reference pin 89 comes into contact with the stopper 64. At the same time, the stopper 64 projects into the path of movement of the reference pin 89. In accomplishing the objectives of the present invention, the pad should be located upstream of the stopper 64 as viewed in the conveying direction to avoid any tilting movement caused by contact of the reference pins 89 with the stopper 64.

As the movement of the printed circuit board P is stopped, the cylinder 58 operates to move the pad 60 apart from the printed circuit board P so that the printed circuit board P starts slightly to move again by the rotation of the rollers 52 but is stopped very soon thereafter since the reference pin 89 abuts the stopper 64. It is therefore possible to stop and locate the printed circuit board P before the printed circuit board is accelerated substantially.

As the printed circuit board P is stopped due to the contact between the reference pins 89 and the stopper 64, the motor 47 is stopped to cease rotation of the rollers 52. Then, the cylinder 62 is actuated to retract the stopper 64 to a stand-by or inoperative position. The retraction of the stopper 64 to the stand-by position triggers the operation of the cylinder 79 which causes the connecting member 81 to be lowered with the result that the arms 72 start to swing as they are pulled by the engaging pins 83, whereby the printed circuit board P is placed on the table 2a as shown in FIG. 13.

When the printed circuit board P is to be returned to the magazine 15 after the drilling on the table 2 of the printed circuit board drilling machine A, the cylinder 97 of the conveyor device C starts to operate, thereby causing the printed circuit board receiving device 98 to project out of the frame 45 towards the table 2. At the same time, the motor 47 starts to operate so as to drive the chain 57 in the direction of the arrow F. Furthermore, the motor 19 of the stocker B starts to operate to bring the storage portion, i.e. the portion where the printed circuit board P is to be stored, of the magazine 15 to the supply/discharge position. Then, the motor 37 starts to operate so as to drive the chain 42 in the direction of the arrow D to start the rollers 40. At the same time, the cylinder 35 operates to shift the rollers 40 to the conveying position.

Subsequently, the cylinder 79 of the delivery device D operates to raise the connecting member 81 so as to bring the hinge roller 82 into engagement with the groove 75a in the bracket 75, thereby swinging the arm 72 to the delivery position shown in FIG. 14. As a result, the printed circuit board C comes to rest on the printed circuit board receiving device 98 of the conveyor device C. In this state, the cylinder 97 connected to the printed circuit board receiving device 98 supporting the printed circuit board P which is the closest to the stocker B is activated to move this receiving device 98 into the frame 54 and the printed circuit board P is therefore transferred from the receiving device 98 onto the rollers 52. The printed circuit board P is then conveyed towards the stocker B as it is brought into frictional contact with the rollers 52.

The approach of the printed circuit board P towards the stocker B is detected by the sensor 90. The cylinder 91 is then started in response to a detection signal from the sensor 90, so as to press the pad 93 onto the printed circuit board P shortly before the end of travel of the board, thereby temporarily stopping the printed circuit board P. Then, the cylinder 91 operates to move the pad 93 apart from the printed circuit board P so that the printed circuit board P is allowed to move again towards the stocker B by the friction between itself and the rotating rollers 52. After the movement of the printed circuit board P towards the back of the stocker is restarted, the printed circuit board P is progressively accelerated but achieves a relatively low speed during its remaining feed into the stocker B because it travels only a small distance after release of the pad 93. It will be appreciated that such an arrangement allows much higher conveying speeds to be used.

The printed circuit board P introduced into the stocker B is then moved to a predetermined portion in the stocker B by means of the rollers 40. As the arrival of the printed circuit board P at this position is detected by the sensor 43, the cylinder 35 operates to lower the base 34 so as to move the rollers 40 to a position below the receiving plates 17a, whereby the printed circuit board P comes to rest on the receiving plates 17a. Subsequently, the motor 19 operates to bring the portion of the magazine 15 holding the next printed circuit board P to the supply/discharge position, and then the cylinder 35 starts to operate to move the rollers 40 to the conveying position. At the same time, the cylinder 97 which is connected to the printed circuit board receiving device 98 which has been again activated to support the next printed circuit board P closest to the stocker B from among the boards P on the conveyor device C is activated so as to move this receiving device 98 into the frame 45, so that the printed circuit board P carried by this receiving device 98 is transferred to the rollers 52. The printed circuit board P then starts to be conveyed towards the stocker B as it comes into frictional contact with the rotating rollers 52. It is thus possible to successively move the several printed circuit boards P which have been drilled on the table 2 into the magazine 15 at much higher conveying speeds.

The present invention permits the conveying speed of the printed circuit board P performed by the conveyor device C to be lowered for a short distance after detection of the printed circuit board P but enables the conveying speed of the printed circuit board to be increased over the longer portion of the conveying device C after the delivery from the magazine 15 until the movement just immediately before the contact of the reference pin 89 with the stopper 64. In addition, the impact is reduced when the reference pin 89 is brought into contact with the stopper 64, thus reducing the tilt of the printed circuit board P. It is therefore possible to shorten considerably the time required for the supply of each printed circuit board P.

In the described embodiment, the printed circuit board 84 is fixed to the base plate 88 when being conveyed This, however, is not essential. For instance, if the fixing pins 87 shown in FIG. 15 are in the same positional relationship to the reference pins 89 shown in FIG. 16, the printed circuit board 84 in the state shown in FIG. 15 may be conveyed without requiring the aid of the base plate 88.

Similarly, if the size of the base plate 88 is determined to be equal to the interval between the fixed guides 2b provided on the sub-tables 2a, it is possible to replace the movable stopper 64 in the described embodiment with a stationary stopper which is provided on the opposite side of the frame 45 to the stocker B for the purpose of locating the base plate.

According to the present invention, the conveying speed of a printed circuit board P is decreased upon detection of the printed circuit board arriving at a position immediately preceding the position where the reference pin comes into contact with the stopper or at a position immediately before the supply into the magazine It is therefore possible to convey the printed circuit board at much higher speed until the board is brought to a position immediately preceding the position where the reference pin of the printed circuit board arriving from the magazine is stopped or the position immediately preceding the position where the drilled printed circuit board is brought into the magazine. In addition, the impact is reduced when the reference pin is stopped by the stopper or when the printed circuit board is stopped at a predetermined position in the magazine, thus eliminating the risk for the printed circuit board to be tilted or bent, and remarkably shortening the time required for the supply of the printed circuit board.

What is claimed is:

1. A printed circuit board supply apparatus, comprising
    means for conveying at least one printed circuit board;
    means for detecting arrival of the at least one printed circuit board at a predetermined position just prior to a supply position where the at least one circuit board is supplied to another apparatus;
    means responsive to the detecting means for braking a movement of the at least one printed circuit board by the conveying means prior to the supply position.

2. A printed circuit board supply apparatus according to claim 1, wherein the braking means is located, as viewed in a conveying direction of the at least one printed circuit board, upstream of the supply position where further movement of the at least one printed circuit board in the conveying direction by the conveying means ceases.

3. A method for supplying at least one printed circuit board from one station to another station at high speeds, comprising the steps of:
    conveying the at least one printed circuit board from the one station along a conveying path,
    detecting the arrival of the at least one printed circuit board at a position just upstream of the another station; and
    braking further conveying of the at least one printed circuit board in response to the detecting step just prior to the arrival of the board at the another station.

4. A method according to claim 3, including the further step of releasing the at least one printed circuit board from braking for movement at a slower speed to the another station.

* * * * *